(12) United States Patent
Williams et al.

(10) Patent No.: US 8,538,936 B2
(45) Date of Patent: *Sep. 17, 2013

(54) SYSTEM AND METHOD FOR DATA COMPRESSION USING COMPRESSION HARDWARE

(75) Inventors: Kenneth Allen Williams, San Jose, CA (US); Michael Liberty, Mountain View, CA (US)

(73) Assignee: Thomson Reuters (Markets) LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/190,099

(22) Filed: Jul. 25, 2011

(65) Prior Publication Data

US 2011/0282849 A1 Nov. 17, 2011

Related U.S. Application Data

(63) Continuation of application No. 12/130,737, filed on May 30, 2008, now Pat. No. 7,987,161.

(60) Provisional application No. 60/957,602, filed on Aug. 23, 2007.

(51) Int. Cl.
*G06F 7/00* (2006.01)
*G06F 17/30* (2006.01)

(52) U.S. Cl.
USPC .......................... 707/693; 707/741; 707/950

(58) Field of Classification Search
USPC ........................ 707/693, 999.101, 741, 950
See application file for complete search history.

(56) References Cited

U.S. PATENT DOCUMENTS

| 5,546,575 | A | * | 8/1996 | Potter et al. | 1/1 |
| 5,734,892 | A | | 3/1998 | Chu | |
| 5,794,229 | A | * | 8/1998 | French et al. | 1/1 |
| 5,813,011 | A | | 9/1998 | Yoshida et al. | |
| 6,199,126 | B1 | | 3/2001 | Auerbach et al. | |
| 6,317,747 | B1 | * | 11/2001 | Bolan et al. | 1/1 |
| 6,438,556 | B1 | | 8/2002 | Malik et al. | |

(Continued)

FOREIGN PATENT DOCUMENTS

WO PCT/US08/66132 9/2008

OTHER PUBLICATIONS

A Guide to IMS Hardware DataCompression; Rich Lewis, Apr. 2004, 13 pages.

(Continued)

*Primary Examiner* — Phuong Thao Cao
(74) *Attorney, Agent, or Firm* — Hoffmann & Baron, LLP

(57) ABSTRACT

A system and method for data compression using compression hardware is disclosed. In accordance with the method, a data set in a data stream is received. The data set includes a set of data descriptor fields. The data set is portioned into one or more data subsets using the set of data descriptor fields. One or more tabular slices and an index are generated for at least one of the data subsets using the set of data descriptor fields. The one or more tabular slices are identified by the index. The one or more tabular slices are compressed into a compressed data block by a data compression scheme using a hardware compressor. A compression data file is generated in a database. The compression data file has a header that stores information about the data compression scheme. The compressed data block is stored in the compression data file.

30 Claims, 12 Drawing Sheets

(56) References Cited

U.S. PATENT DOCUMENTS

| | | | |
|---|---|---|---|
| 6,493,728 | B1 | 12/2002 | Berger |
| 6,542,896 | B1* | 4/2003 | Gruenwald ............................ 1/1 |
| 6,618,728 | B1* | 9/2003 | Rail ....................................... 1/1 |
| 6,850,906 | B1 | 2/2005 | Chadha et al. |
| 6,879,266 | B1 | 4/2005 | Dye et al. |
| 6,883,079 | B1 | 4/2005 | Priborsky |
| 6,959,300 | B1 | 10/2005 | Caldwell et al. |
| 6,965,897 | B1 | 11/2005 | Chen |
| 7,051,126 | B1* | 5/2006 | Franklin ......................... 710/68 |
| 7,103,608 | B1 | 9/2006 | Ozbutun et al. |
| 7,117,203 | B2 | 10/2006 | Gilfix et al. |
| 7,143,076 | B2* | 11/2006 | Weinberg et al. ..................... 1/1 |
| 7,181,457 | B2 | 2/2007 | Reinauer et al. |
| 7,200,603 | B1 | 4/2007 | Hitz et al. |
| 7,275,065 | B2 | 9/2007 | Prager |
| 7,281,004 | B2 | 10/2007 | Lightstone et al. |
| 7,299,239 | B1* | 11/2007 | Basu et al. ............................ 1/1 |
| 7,321,937 | B2 | 1/2008 | Fallon |
| 7,496,589 | B1* | 2/2009 | Jain et al. ............................. 1/1 |
| 7,636,804 | B2 | 12/2009 | Bolt et al. |
| 2003/0187761 | A1* | 10/2003 | Olsen et al. ...................... 705/35 |
| 2004/0030847 | A1 | 2/2004 | Tremaine |
| 2004/0107184 | A1* | 6/2004 | Longshaw ......................... 707/3 |
| 2006/0117212 | A1* | 6/2006 | Meyer et al. ...................... 714/4 |
| 2006/0184556 | A1 | 8/2006 | Tan et al. |
| 2006/0218190 | A1 | 9/2006 | Frost et al. |
| 2007/0174209 | A1 | 7/2007 | Fallon et al. |
| 2008/0055331 | A1* | 3/2008 | Iourcha et al. ................. 345/582 |
| 2008/0091642 | A1* | 4/2008 | Bestgen et al. .................... 707/2 |
| 2008/0092163 | A1* | 4/2008 | Song et al. ....................... 725/39 |
| 2009/0012982 | A1 | 1/2009 | Merchia et al. |
| 2009/0024498 | A1 | 1/2009 | Berezuk et al. |
| 2009/0287628 | A1* | 11/2009 | Indeck et al. .................... 706/47 |

OTHER PUBLICATIONS

AHA362-PCIX; 3.0 Gbits/sec GZIP CompressioniDecompression Accelerator (preliminary Product Brief) pb362-PCIX 0405; © 2005 Comtech AHA Corp., 2 pages.

AHA Application Note; AHA362-PCIX; GZIP Compression Accelerator Quick Start Guide; ANQS362-PCIX 0805; 6-pages.

CebaTech-News-0.txt Clive Maxfield; Programmable Logic DesignLine; May 15, 2007, 1 page.

CAM-for-DataCompression.txt; Romain Saha; ED Online ID #5799; Sep. 29, 2003, 6 pages.

Datadomain White Paper; Dedupe-CentricStorage; Hugo Patterson, Chief Architect, Data Domain; Sep. 2007; 9-pages.

ESG; Data De-duplication and Disk-to-Disk Backup Systems; Tony Asaro and Heidi Biggar; Jul. 2007, 15 pages.

GEMAC mbh Enhanced Lossless Data Compression (ELDC-II) IP-Core Product Specification Version 2.01; Nov. 24, 2004, 17 pages.

GEMAC FPGAs for lossless image/video and universal data compression; Dr. Claus Dittrich; Apr. 2005; ECE magazine, 3 pages.

GEMAC ELDC-II IP-Core: Enhanced Lossless Data Compression, 2 pages.

GMBH-News-0; Lossless data compression solutions for combined data, image and video now readily available as an FPGA core; Electronics Express Europe; eeProductCenter; (Jan. 19, 2005 5:06 AM ET); Chemnitz, Germany, 1 page.

An Explanation of the Deflate Algorithm; Antaeus Feldspar; article was originally posted to como.compression on Aug. 23, 1997, 5 pages.

gzip-deflate-description.txt; An Explanation of the Deflate Algorithm; Antaeus Feldspar; article was originally posted to comp.compression on Aug. 23, 1997, 4 pages.

Hifn; Condense Your VTL Acceleration with Mini Data Compression Board Express VTL 600 Compression Board; 2 pages, 2007.

IBM-Journal-Feb-I998; A fast hardware data compression algorithm and some algorithmic extensions by D. J. Craft; 12-pages, Feb. 1998.

NTFS Documentation; Richard Russon and Yuv Al Fledel; Total of 138 pages.

SNIA—Storage Networking Industry Association—Education; Lossless Data Compression in Storage Networks; Tony Summers, Comtech AHA; Oct. 2006; 32-pages.

Hifn—Technical White Paper—Feb. 2005; LZS Compression Benefits of TLSComp (WP-0129-00); 10-pages.

MX4e-DriverTest.cpp; 3-pages.

Vhayu; Mutual Nondisclosure Agreement; 1-page, 2005.

ntfs-concepts (06-05-07).txt; Clusters; 3-pages.

ntfs-concepts-I (06-05-07).doc; 7-pages.

OLIXIR Technologies; News Release SC-IOOO; Milpitas, Calif.—Feb. 1, 2007; 3-pages.

Samplify-News-0.txt; Clive Maxfield; Programmable Logic DesignLine; (Apr. 3, 2007 8:00 AM ET); 2-pages.

StorCompress™; Hardware Compression Engine; StorCompress 300; 2-pages, 2005.

Indra Networks; 450 MB/s Compression; StorCompress MX3™ compression coprocessor; 4-pages, 2006.

Taneja Group Technology Analysts; Technology Brief; The Importance of Operational Simplicity in Selecting Disk-to-Disk Data Protection Solutions; May 2007; The Net Net; 7-pages.

Run-length coding extensions for high performance hardware data compression; J.L. Nunez and S. Hones; 2003; 9-pages.

* cited by examiner

MSFT.trade

| Time-1 | C2 | C3 | C4 | C5 |
|---|---|---|---|---|
| Time-2 | C2 | C3 | C4 | C5 |
| Time-3 | C2 | C3 | C4 | C5 |
| Time-4 | C2 | C3 | C4 | C5 |
| Time-5 | C2 | C3 | C4 | C5 |

CSCO.trade

| Time-1 | C2 | C3 | C4 | C5 |
|---|---|---|---|---|
| Time-2 | C2 | C3 | C4 | C5 |
| Time-3 | C2 | C3 | C4 | C5 |
| Time-4 | C2 | C3 | C4 | C5 |
| Time-5 | C2 | C3 | C4 | C5 |

GOOG.trade

| Time-1 | C2 | C3 | C4 | C5 |
|---|---|---|---|---|
| Time-2 | C2 | C3 | C4 | C5 |
| Time-3 | C2 | C3 | C4 | C5 |
| Time-4 | C2 | C3 | C4 | C5 |
| Time-5 | C2 | C3 | C4 | C5 |

FIG. 2C

MSFT.trade

| Time-1 | C2 | C3 | C4 | C5 |
|---|---|---|---|---|
| Time-2 | C2 | C3 | C4 | C5 |
| Time-3 | C2 | C3 | C4 | C5 |

| Time-4 | C2 | C3 | C4 | C5 |
|---|---|---|---|---|
| Time-5 | C2 | C3 | C4 | C5 |

CSCO.trade

| Time-1 | C2 | C3 | C4 | C5 |
|---|---|---|---|---|
| Time-2 | C2 | C3 | C4 | C5 |

| Time-3 | C2 | C3 | C4 | C5 |
|---|---|---|---|---|
| Time-4 | C2 | C3 | C4 | C5 |
| Time-5 | C2 | C3 | C4 | C5 |

GOOG.trade

| Time-1 | C2 | C3 | C4 | C5 |
|---|---|---|---|---|
| Time-2 | C2 | C3 | C4 | C5 |
| Time-3 | C2 | C3 | C4 | C5 |
| Time-4 | C2 | C3 | C4 | C5 |
| Time-5 | C2 | C3 | C4 | C5 |

FIG. 2D

SYSTEM AND METHOD FOR DATA COMPRESSION USING COMPRESSION HARDWARE

CROSS REFERENCE TO RELATED APPLICATIONS

This application is a continuation of U.S. patent application Ser. No. 12/130,737 filed on May 30, 2008, now U.S. Pat. No. 7,987,161, issued 26 Jul. 2011, which claims the benefit of and priority to U.S. Provisional Patent Application No. 60/957,602 filed on Aug. 23, 2007, the disclosures of which are hereby incorporated in their entireties by reference herein.

BACKGROUND

1. Field

The field of the invention relates generally to data compression and more particularly relates to a system and method for compressing financial data using data compression hardware.

2. Brief Discussion of Related Art

Lossless data compression methods in streaming database systems reduce storage requirements, improve access performance to stored data, and minimize use of computational resources to perform data compression and restoration. An often-unstated but intrinsically assumed goal for such streaming database systems is to provide uninterrupted access to compressed data. The conflicting nature of these goals, in a practical implementation of a streaming database system, generally results in compromised solutions that achieve gains toward one goal at the expense of another. Storage requirements may be reduced by transformations on the data, such as ordering data in columns or implementing record- or field-level data compression, but the cost is usually reduced performance for data access and increased computational requirements to perform the transformations.

Since lossless data compression is a computationally expensive operation, software compression solutions are not practical for high-performance database systems and are only adequate for database systems that do not have stringent performance requirements. Hardware accelerated data compression is one practical solution suitable for performance-hungry database systems. However, data compression hardware, as in any hardware resources, is subject to malfunction and requires a fail-safe mechanism to guarantee the integrity of and access to compressed data in the event of partial or total hardware malfunction.

Streaming database systems require random access to data, whether compressed or uncompressed. Any attempt to retrofit compression into an existing database, or to design compression into a newly constructed database, must provide a mechanism guaranteeing efficient random access to compressed data. Moreover, since not all data is compressible, both uncompressed and compressed data coexist in the database and the data access mechanism must be efficient for both types of data.

SUMMARY

According to one embodiment, a computer-implemented method of compressing data is disclosed. The method includes receiving a data set in a data stream. The data set includes a set of data descriptor fields. The data set is partitioned into one or more data subsets using the set of data descriptor fields. Using the set of data descriptor fields included, one or more tabular slices and an index are generated. The one or more tabular slice are identified by the index. The one or more tabular slices are compressed into a compressed data block by a data compression scheme using a hardware compressor. A compression data file is generated in a database. The compression data file has a header that stores information about the data compression scheme. The compressed data block is stored in the data file.

According to another embodiment, a computer-readable storage medium is disclosed. The computer-readable storage medium stores a plurality of instructions that, when executed by a computing system, cause the computing system to perform the following operations. The instructions cause the computing system to receive a data set in a data stream. The data set includes a set of data descriptor fields. The instructions cause the computing system to partition the data set into one or more data subsets using the set of data descriptor fields. The instructions cause the computing system to generate one or more tabular slices and an index for at least one of the data subsets using the set of data descriptor fields. The one or more tabular slices are identified by the index. The instructions cause the computing system to compress the one or more tabular slices into a compressed data block by a data compression scheme using a hardware compressor. The instructions cause the computing system to generate a compression data file in a database. The compression data file has a header that stores information about the data compression scheme. The instructions cause the computing system to store the compressed data block in the compression data file.

The above and other preferred features, including various novel details of implementation and combination of elements, will now be more particularly described with reference to the accompanying drawings. It will be understood that the particular methods and systems described herein are shown by way of illustration only and not as limitations. As will be understood by those skilled in the art, the principles and features described herein may be employed in various and numerous embodiments without departing from the scope of the invention.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles of the present embodiments.

FIG. 2C illustrates exemplary U.S. equities tick data stream partitioned into three sets of stock tables, according to one embodiment;

FIG. 2D illustrates exemplary U.S. equities tick data tables partitioned into five tabular slices, according to one embodiment;

Figure 1:
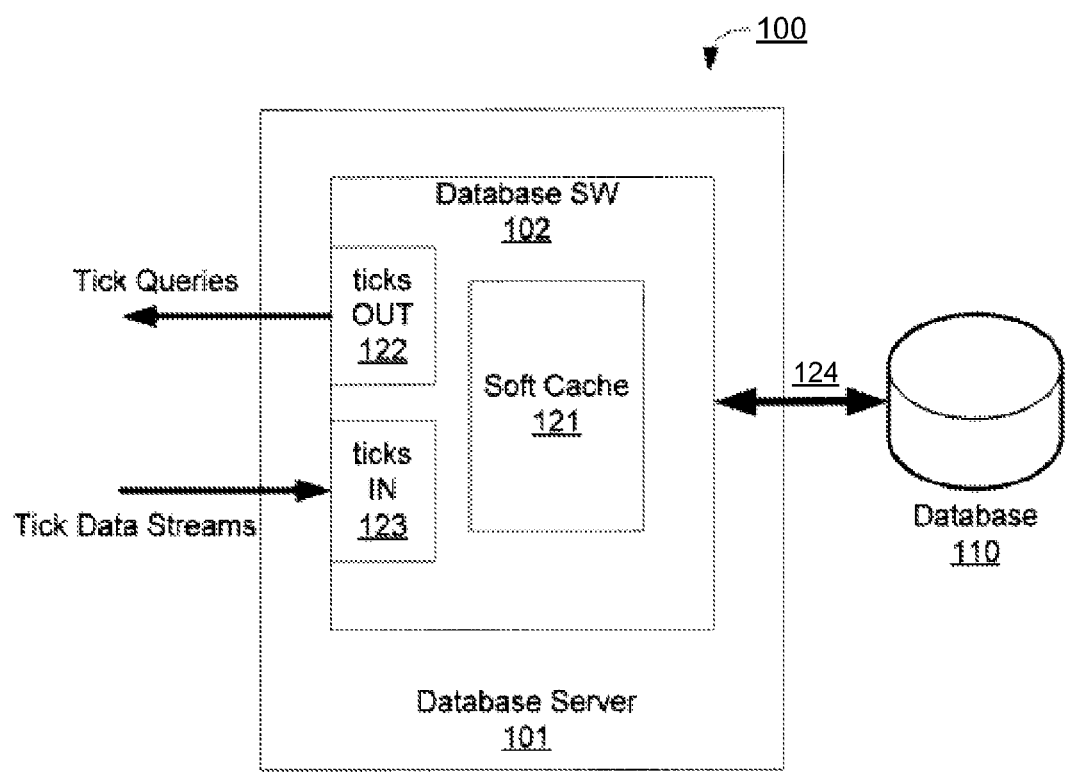
FIG. 1 illustrates an exemplary block diagram of a data compression system for processing financial tick data streams, according to one embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A system and method for data compression using compression hardware is disclosed. Each of the features and teachings disclosed herein can be utilized separately or in conjunction with other features and teachings to provide a method and system for vision-based interaction in a virtual environment. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for the purposes of explanation, specific nomenclature is set forth to facilitate an understanding of the various inventive concepts disclosed herein. However, it will be apparent to one skilled in the art that these specific details are not required in order to practice the various inventive concepts disclosed herein.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but is not limited to, any type of disk including floppy disks, optical disks, CD-ROMs, and magnetic-optical disks, read-only memories, random access memories, EPROMs, EEPROMs, magnetic or optical cards, or any type of media suitable for storing electronic instructions, and each coupled to a computer system bus.

The methods presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 illustrates an exemplary block diagram of a data compression system 100 for processing financial tick data streams, according to one embodiment. Database server 101 runs database software 102 and connects to database 110 to capture, store and retrieve ticks in a financial tick data stream. Financial tick data includes data records for equities, options, bars and other configurable financial instruments. Financial data may be dynamically derived from computational combinations of ticks in the tick data stream. Derived ticks are dynamically constructed in real time. Each tick is a data record associated with a uniquely named financial instrument having one or more data fields, such as price, volume, exchange, etc. Each tick has a record type and an associated format that is either predefined in database 110 or defined in a configurable record schema file. Each tick also has an associated time that identifies its precise location in the tick data stream.

Figure 2A:
FIG. 2A shows exemplary financial tick data, according to one embodiment.

FIG. 2A shows exemplary financial tick data, according to one embodiment. A tick data stream is a time-ordered series of ticks representing information regarding financial instruments, such as price, volume, etc. A tick contains a set of descriptor fields and a variable set of configurable or predefined data fields. Ticks in a tick data stream are partitioned into and uniquely stored in mutually exclusive tables such that the union of all ticks in the tables constitutes the tick data stream. The descriptor fields used to partition ticks into a set of tables are symbol 201, record type 202 and time stamp 203. The data field 204 includes price, volume and exchange identification. It is noted that other descriptor fields and data fields may be used.

FIG. 2C illustrates exemplary U.S. equities tick data partitioned into three sets of stock tables, according to one embodiment. All trade ticks received in the tick data stream for the symbol MSFT are stored in a time order sequence in the table for MSFT trades, and similarly for CSCO and GOOG. FIGS. 2C and 2D show that each tick has a fixed number of columns; however, the present method and system supports ticks that have a variable number of columns. For convenience, the time stamps are explicitly shown (e.g., time−1, time−2) while the configurable fields are shown as "Cx", where x is a column number. Configurable fields are processed as opaque binary data by a compression engine in database software 102.

According to one embodiment, database software 102 runs as an application on a standard Windows Server platform. Database software 102 supports input interface 123 for an incoming tick data stream, output interface 122 for outgoing ticks to satisfy client queries and database 110 interface 124 to read/write data from/to database 110. Different operating systems and server platforms may be used without deviating from the scope of the present subject matter.

Database software 102 receives streaming financial tick data from an incoming tick data stream. Database software 102 processes and stores tick data in a tabular form in persistent database 110. When a client queries a tick data, database software 102 retrieves the tick data from persistent database 110 and presents it to the client. According to one embodiment, database software 102 maintains recently accessed tick data in an internal soft-cache 121 to improve retrieval performance for frequently accessed tick data.

Database software 102 further partitions each tick data table into a set of tabular slices and stores the set in database 110 while the tick data stream is received. In one embodiment, tabular slices are constructed to be mutually exclusive, index addressable and non-overlapping.

According to one embodiment, tick data is bulk-loaded by database software 102 in the same manner as used for processing tick data streams in real time. All tick data may be stored in the same format in database 110 regardless of the input data format, and database software 102 employs a unified method to retrieve tick data from database 1 10, whether the tick data was bulk-loaded or inputted from tick data streams.

According to one embodiment, a key is computed from the descriptor fields of the ticks stored in a tabular slice. The key is added to an index used for rapid random access to ticks in a tabular data set. A data portion of the key contains the address of the tabular slice in database 110 and is used to locate the tabular slice for query and update access. FIG. 2D illustrates exemplary U.S. equities tick data tables partitioned into five tabular slices, according to one embodiment; tick data for MSFT and CSCO are partitioned into two slices each and tick data for GOOG is partitioned into a single tabular slice.

Figure 2B:
FIG. 2B illustrates exemplary tabular slices, according to one embodiment.

FIG. 2B illustrates exemplary tabular slices, according to one embodiment. Each tabular slice is consolidated into a buffer stored in contiguous memory locations and referred to as a slice buffer. Each slice buffer is index addressable. The address of each slice buffer is shown as "uTSn", where n is a slice number. Five keys are created in a B-Tree index—one for each of the five tabular slices—and each key contains the address of the tabular slice buffer in database 110.

Tabular data may be partitioned into tabular slices in any number and in many ways. Each tabular slice is index addressable and non-overlapping with other tabular slices, and the union of the tabular slices forms a set of tabular data. Each row in a tabular slice may contain a variable number of columns and different descriptor fields. A tabular slice is stored in a slice buffer in a contiguous sequence.

Streaming data is received and added into memory using the descriptor fields in the time series. For each unique combination of descriptor fields, separate tabular slices are created. In database 110, partitioning of tabular data into tabular slices is accomplished by a dynamic algorithm. When a tabular slice for a particular table already exists in database 110 and the tabular slice has reached its size, input to the tabular slice is closed and the next received tick data is stored in a new tabular slice with a new access key created in reference to the descriptor fields with a new time stamp. In this manner, a set of non-overlapping tabular slices is created for all the ticks in a tick data stream and the union of the tabular slices is used to reconstruct a complete set of tabular data in the tick data stream.

Due to the dynamic nature of streaming financial tick data, a tabular slice is created and closed based on the number of ticks stored in the tabular slice. For example, the three ticks: MSFT.trade.9:00 AM, CSCO.quote.9:00 AM and GOOG.trade.9:00 AM are received at 9:00 AM, and three tabular slices: MSFT.trade, CSCO.quote and GOOG.trade are created. The next tick at 9:01 AM is received: MSFT.trade.9:01 AM, MSFT.trade.9:01 AM and CSCO.quote.9:01 AM. The first two MSFT.trade ticks are added as rows 2 and 3 in the MSFT.trade tabular slice created earlier, and the CSCO.quote is added in row 2 in the CSCO.quote tabular slice. As more tick data arrive, database 110 monitors the number of tabular slices and the size of each tabular slice. When a new tick data for an existing tabular slice arrives, database 110 determines whether or not the tabular slice reached its size. For instance, tabular slices in FIG. 2D contain two, three and five ticks. Depending on the size of tick data, I/O bus speed and other system specifications affecting query performance, the size of tick slices varies. When the tabular slice has reached its size, database software 102 determines to close input to the tabular slice and stores the tabular slice from soft-cache 121 to a data file in database 110. When the next tick data arrives, a new tabular slice is created in soft-cache 121 and the new tick data is stored as the first row in the new tabular slice.

Tabular slices may vary in size and several criteria may be used to determine the size of a tabular slice, according to one embodiment. For example, the streaming rate of tick data determines the size of tabular slices. Alternatively, the amount of storage required to hold the tabular, historical information regarding the expected size for tabular slices, or historical information regarding the most efficient size of tabular slices for query access, may be used to determine the size of tabular slices. The size of each tabular slice derived from the tick data stream may be different from the other tabular slices derived from the same stream, and the size for tabular slices for each instance is set to yield the best query performance.

According to one embodiment, each tick data in a tabular slice is transformed or compressed before the tabular slice is transformed into a slice buffer. In a preferred embodiment, each tick data in a tabular slice is transformed into an opaque binary object, often referred to as a "blob." For example, null fields are removed from the tick data during the transformation of the tick data into a blob. Other field-level transformations may be performed to replace large field values with smaller encoded values to compact the size of the tick data. Since this record- or field-level transformation of tick data is performed prior to data compression of tabular slices into slice buffers, the data compression is transformation independent from any record- or field-level transformations applied to the tick data.

According to one embodiment, database 110 is implemented as a set of data files in the Windows file system. A user-configurable mapping algorithm, such as "round-robin by symbol" or "symbol directed," directs the storage of slice buffers and index keys into data files. Tabular slices are stored in data files and the associated keys are stored in B-Trees that are mapped into the Windows file system.

In one embodiment, when database 110 builds data files using a software utility to bulk-load tick data, the software utility creates one data file and one B-Tree file and maps all the tabular slices into the one data file and all the associated keys into the one B-Tree file. In another embodiment, the number of data files is configured from a database configuration file that stores a list of data file names and a user-configurable set of instructions. By this "symbol directed" mapping, all the tabular slices for the symbol MSFT, CSCO and GOOG are stored in "file1.dat," "file2.dat" and "file3.dat," respectively, as shown in FIG. 3.

In the event that a symbol mapping direction is not provided, database software 102 writes all the tabular slices for one symbol to one of the configured data files. Database 110 selects which data file to use for a symbol on a "round-robin" basis, and once a data file is selected for a symbol, all the tabular slices for that particular symbol are stored in the data file. This mapping algorithm is referred to as "round-robin by symbol" mapping.

The inputs to the data mapping algorithm include a set of file paths and optional user-configurable mapping instructions. Tabular slices and the associated indices are mapped to data files configured by symbol directions in the user-configurable mapping instructions. According to one embodiment, "round-robin by symbol" is used. If only one file path path is configured, all tabular slices are stored in a data file with the name "path.dat," and all keys are stored in an index file, "path.idx." If multiple file paths are configured and no user-configurable mapping instruction is provided, the symbols are distributed among the files according to the "round-robin" algorithm, resulting in an even distribution of symbols to data files. If user-configurable mapping instructions are provided, all symbols are distributed by the symbol directions and the remaining symbols are mapped using the "round-robin" algorithm.

Figure 3:
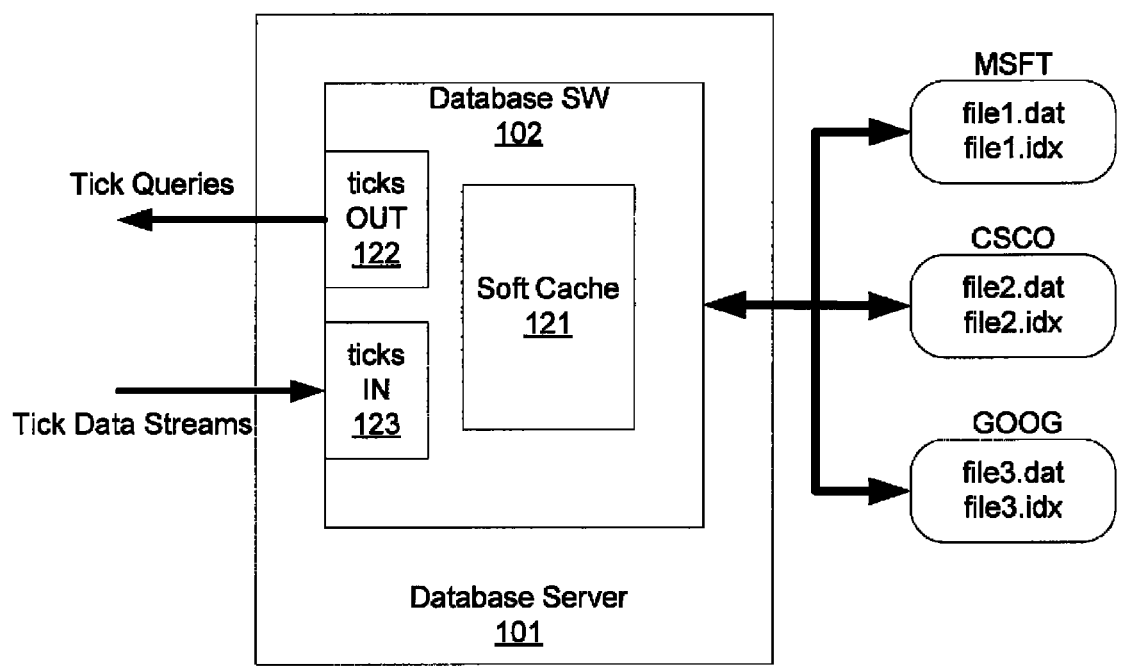
FIG. 3 illustrates an exemplary mapping process for tick data and index files, according to one embodiment.

FIG. 3 illustrates an exemplary mapping process for tick data and index files, according to one embodiment. The three tick data sets are mapped into three data and index files distributed across three data files in database 110. This mapping method provides superior I/O performance for parallel access to the three tables since each access traverses a dedicated I/O path. Although FIG. 3 illustrates only three tabular data sets, database 110 can handle millions of tabular data sets and symbols.

Figure 4:
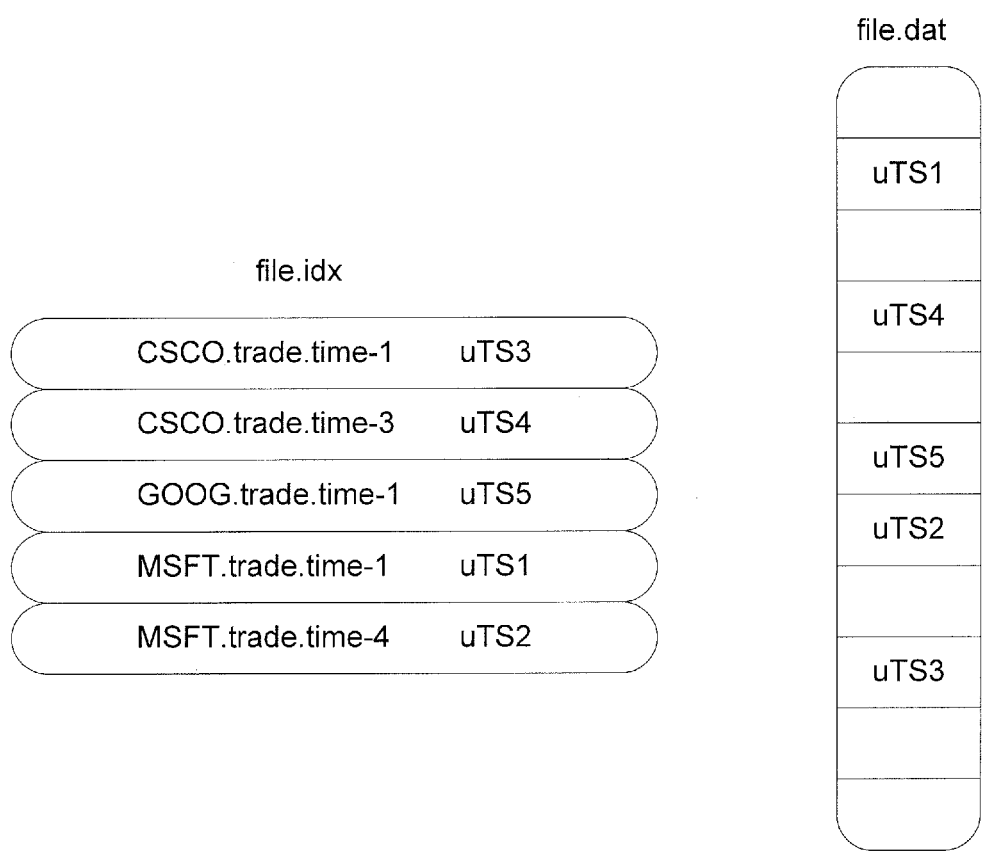
FIG. 4 illustrates exemplary index and data files, according to one embodiment.

FIG. 4 illustrates exemplary index and data files, according to one embodiment. Data file, "file.dat," contains a set of uncompressed index-addressable tabular slices (uTS1, uTS2, ..., uTSn) and is associated with an index file, "file.idx." Each of the slice buffers for the tabular slices, uTSx, are stored in a Windows file at random locations. For example, uTS1 is stored in the file, followed by uTS4, followed by uTS5, followed by uTS2. Access to the uncompressed tabular slices requires an index lookup by using a key, including a symbol, record type and time, etc., to identify the location of a tabular slice in the data file. The key "MSFT.trade.time-1" is used to search the B-Tree index to identify the location for the tabular slice uTS1. The use of the B-Tree index provides rapid random access to the uncompressed tabular slices stored in database 110.

According to one embodiment, database software 102 implements an internal soft-cache 121 to encapsulate access to tick data. Soft-cache 121 efficiently manages the transfer of tabular slice buffers to and from database 1 10, synchronizes update/query access to slice buffers and improves retrieval performance for frequently accessed tick data. Slice buffers are written into soft-cache 121 after being created, and the associated key is written directly to the B-Tree index in the index file (.idx). According to one embodiment, soft-cache 121 provides access to the slice buffers using a least-recently-used cache replacement policy and flushes newly created slice buffers to database 110 in an appropriate data file (.dat).

According to one embodiment, each tabular slice is index addressable, and a tick data within a tabular slice can be located using an index file that is implemented in a B-Tree format when the tabular slice was created and stored in database 110. For example, a client query requests tick data for "MSFT.trade" in the time range from "time-1" to "time-4" by:

"query/symbol MSFT/recordtype trades/start time-1/
end time-4."

A key is created using the values in the query to locate the data files that contain the tabular slices that satisfy the query condition:

key=<MSFT, trades, time-1, time-4>.

Using the key, database software 102 finds the locations of the tabular slices in database 110 that contain tick data for MSFT-.trade in the requested time range from "time-1" to "time-4." In the present example, the two tabular slices containing tick data for MSFT.trade from "time-1" to "time-4" are uTS1 and uTS2.

Figure 5:
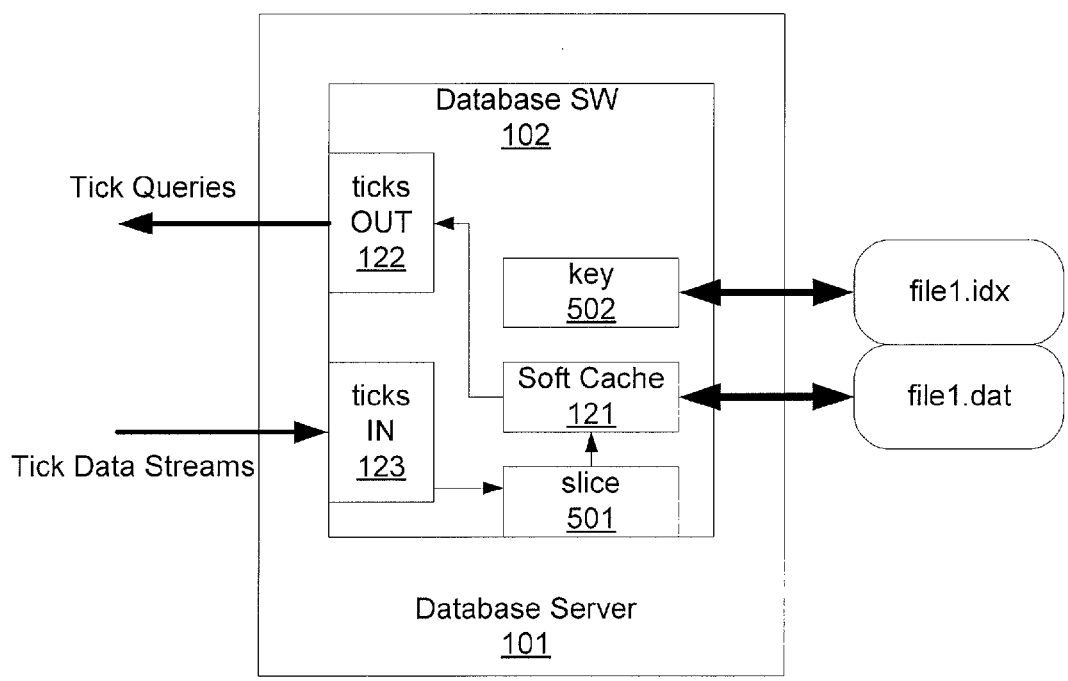
FIG. 5 illustrates an exemplary process for reading and writing slice buffers from and to a persistent database, according to one embodiment.

FIG. 5 illustrates an exemplary process for reading and writing slice buffers from and to database 1 10, according to one embodiment. Tick data are received in a tick data stream by input interface 123. A slice buffer 501 and its associated key 502 are created from the received tick data in the memory. The slice buffer 501 is written into soft-cache 121 and the key 502 is written into the B-Tree index, "file1.idx." Soft-cache 121 writes the newly created tabular slice buffer to the data file, "file1.dat." Soft-cache 121 retains the slice buffer 501 in cache to facilitate rapid access.

A client's query for reading a tick data starts with constructing a key. Using the key, database software 102 accesses the index file, file1.idx, to identify the location of the slice buffer containing the desired tick data. If the slice buffer is not available in soft-cache 121, it is read from a data file, file1.dat, in database 110 and copied into soft-cache 121 to grant the query client an access to the slice buffer via output interface 122. Database software 102 may attempt an update access to the queried slice buffer in order to apply a correction to tick data contained in the tabular slice. Subsequent query access attempts may be held in a pending state until the outstanding query access completes.

Database software 102 accesses an index file to identify the location for a desired slice buffer, and reads the slice buffer into soft-cache 121 if it is not available in soft-cache 121. According to one embodiment, database software 102 is a multi-threaded database software that maps execution of threads onto multiple cores of database server 101's platform. Two database software code threads may concurrently attempt to access a slice buffer in soft-cache 121. Database software 102 synchronizes access from multiple threads so that update and query operations are serialized.

Figure 6:
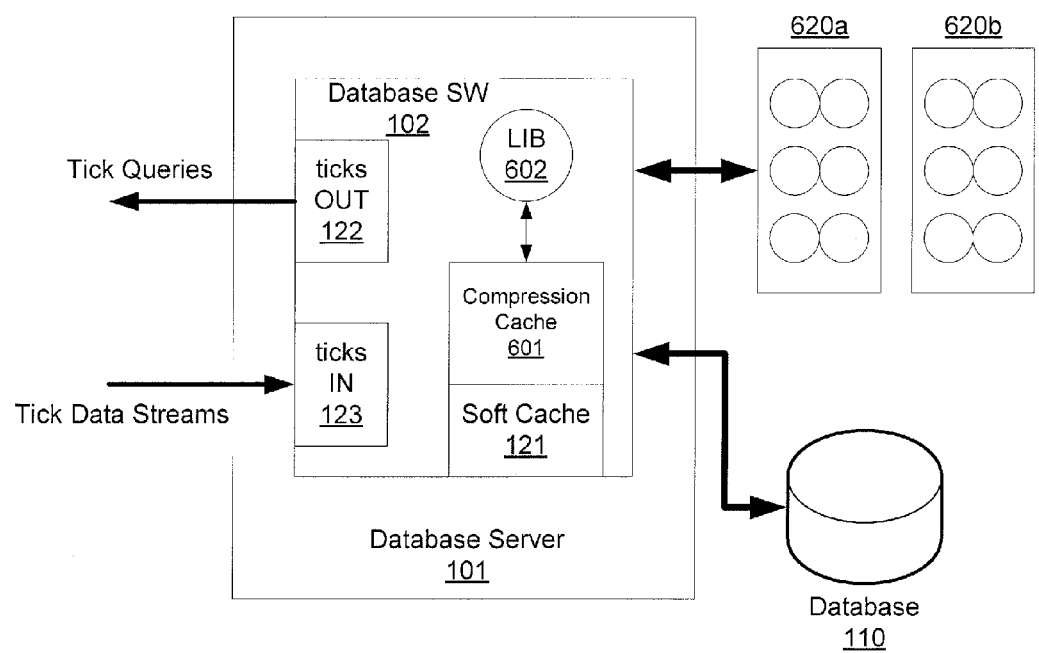
FIG. 6 illustrates an exemplary block diagram of a data compression system integrating data compression hardware, according to one embodiment.

According to one embodiment, the present method and system integrates compression hardware into a database engine for streaming financial data. FIG. 6 illustrates an exemplary block diagram of a data compression system integrating data compression hardware, according to one embodiment. One or more data compression cards 620 are integrated with database server 101 via the PCIe bus, and each hardware card 620 contains one or more compression/decompression engines. A compression cache 601 is used as a container for data in transition between compressed and uncompressed forms.

Database software 102 enables a pool of pre-configured software compression and decompression engines and applies an appropriate compression and decompression engine to store and retrieve tick data. According to one embodiment, two MX4e compression cards by Indra Networks are installed and each of the MX4e cards have multiple compression engines. Database 110 may be hosted on multiple hard disk drives for redundant storage. A compression library 602 may be provided by database software 102 or other database software that database server 101 uses. According to one embodiment, compression cache 601 is implemented as an extension of soft-cache 121 and positioned so as to shield compression operations from soft-cache 121 to achieve compression transparency.

According to one embodiment, data compression is selectively applied to slice buffers based on the compression type of the data file that contains the slice buffers. Tick data tables may be selectively mapped to data files in database 110. Data files may be individually configured as either compressed or uncompressed files. If a data file is configured as a compressed data file, compression is automatically applied to all the slice buffers in the data file. Slice buffers are compressed before being written to the data file and are uncompressed after being read from the data file. These compression functions are encapsulated in software compression cache 601 internal to database software 102 in order to be transparent to other database operations.

For example, data compression system 100 is installed in a system that already has uncompressed data files. All the existing data files may be compressed using an off-line software utility supplied by the database system. Alternatively, some existing data files are compressed while some are left uncompressed. In the latter case, when database software 102 accesses a data file in database 110, a decision is made based on the compression attribute stored in the metadata for the data file whether or not to apply data decompression to the tabular slices stored in the data file.

Compression type of each data file is user configurable and specified when a data file is created. The compression type becomes an attribute of the data file and is used to select a compressor or decompressor from either the pool of hardware compression engines installed in database server 101 or from the pool of software compression engines accessible by database software 102. According to one embodiment, a data file is created by an off-line software utility, with which a user specifies the name for the data file and its associated compression type. According to another embodiment, an instruction to create data files is provided in an initialization file. The instruction may include a list of data files and the compression type to use for the data files in the list.

Database server 101 supports different compression types concurrently. According to one embodiment, one data file is configured with a compression type specified for a hardware compression card while another data file is configured with a compression type specified for a software compressor embedded in the database software 102, and a third data file is uncompressed. These data files are concurrently accessible and an appropriate compressor/decompressor engine is selected for each data file as needed to process slice buffers that are transferred to/from a particular data file. The compression type of a data file is read by database software 102 when the data file is opened for access and is used to control access to the tabular slice buffers stored therein.

According to one embodiment, database software 102 provides utilities to convert a data file to another data file with a different compression type. Compression type conversion is particularly useful in a disaster recovery scenario following a hardware malfunction when replacement hardware cards are not available. In one example, a data file is converted from a hardware compressed format to an uncompressed format. In another example, a data file is converted from an uncompressed format to one of the supported hardware compression formats. This conversion is particularly useful when upgrading an existing database 110 to support hardware compression. In yet another example, all or part of the uncompressed data files may be converted to a supported compression type before loading it into a data compression system. Compression type conversion might also be useful for migrating from one database system to another. In this case, database software 102 accesses each loaded data file in the existing database system and the access results are used to plan a data migration strategy for conversion to another database system.

Data compression hardware is subject to various types of malfunction. Detectable hardware failures are component failures, bus arbitration errors and any other hardware related failures. Detectable software failures include invalid request parameters, buffer size errors, invalid checksum in compressed data and any other software-related failures. Silent data compressor malfunctions cause corruption of compressed data without a reported failure. To detect failures caused by compressor malfunction, compressor verification logic runs the corrupted compressed data through a decompressor and optionally compares the uncompressed data with the data originally processed by the compressor. When the restoration of the corrupted data is successfully performed, the operation on the data continues. When the corrupted data cannot be successfully restored by the compressor verification logic, database software 102 notifies such failure and, depending on the failure type, a proper action is taken. For example, in the event of a detectable hardware failure, database software 102 avoids using the failed hardware for data compression and notifies the user for such hardware failure.

The present method and system recovers from hardware compression failures and continues data operation without performance degradation in the event of partial or total hardware malfunction. Hardware compression cards and the associated software drivers detect and report most hardware failures. Some hardware compression cards provide compressor verification logic to detect silent compressor malfunctions and report the error to the user. For a hardware compressor card that is not equipped with an internal compressor verification logic, software compressor verification logic performs similar functions as the internal compressor verification logic and detects hardware failures and malfunctions.

When a hardware malfunction is detected, client requests are redirected by request redirection logic that redirects client requests by configurable compression failover policies, such as "abort-on-error," "failover to alternate hardware engine," "failover to compressor bypass," "failover to software decompress," etc.

"Abort-on-error" is a redirection policy to abort operations associated with data compression/decompression that is used when a hardware malfunction is detected. In the event of a partial hardware malfunction, the "failover to alternate hardware engine" policy may be used to redirect client requests from the failed hardware compression engine to a functional hardware compression engine. According to one embodiment, a hardware compression card driver automatically redirects failed requests to its functioning internal compression engines, in which case database software 102 simply issues incoming requests to the hardware compression card without having a burden of redirecting requests in the event of hardware failure. When the hardware compression card driver does not automatically redirect failed requests based on the status of the hardware, database software 102 may interfere and redirect the failed requests to a functional compression card.

In the event of a total hardware malfunction, the "failover to compressor bypass" policy may be used to bypass data compression so that a slice buffer is written to a data file in an uncompressed form. This allows real-time operation to continue without a performance penalty. Metadata is written to the data file with the slice buffer to identify the format of the data. Database software 102 or one of its batch utilities automatically bypasses decompression when the slice buffer is read.

In another event of a total hardware malfunction, the "failover to software decompress" policy may be used. Database software 102 applies decompression to a compressed slice buffer using a compatible software decompressor. This is a non-configurable fail-safe feature that allows real-time operation or disaster recovery to continue in the event of a total hardware failure.

According to one embodiment, compressed slice buffers are stored in database 110 in a format referred to as a compression block. Database software 102 combines one or more uncompressed tabular slices in memory buffers in database server 101 and compresses the data from the memory buffer into CBLOCK 703. CBLOCK 703 is padded with null characters to force the size of the CBLOCK 703 to be a multiple of the sector size of the file system of database 110. The null padding referred to as a "slack space" allows efficient use of the I/O bandwidth of database 110.

According to one embodiment, multiple uncompressed tabular slices are combined into a CBLOCK 703 and data compression is applied to the content of the CBLOCK 703 independent of tabular slice boundaries. Since the size of tabular slices varies depending on the dynamics of the incoming tick data stream, data compression with varying sizes for each tabular slice may result in a poor compression rate. This is especially true when the size of slice buffers is very small (e.g., 512 bytes). In this case, in order to achieve good compression rates, data compression is applied to a collection of slice buffers rather than to individual slice buffers. The size of the data to which data compression is applied is stored in the compressed data file as an attribute. Once the compression size is set, it is applied to all CBLOCKs in a data file.

Figure 7A:
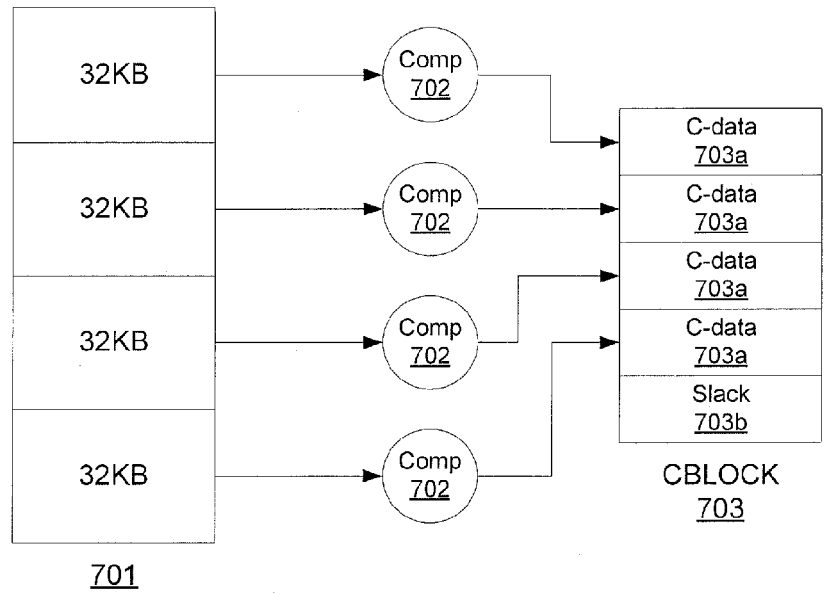
FIG. 7A illustrates an exemplary process for constructing a compressed block from a slice buffer, according to one embodiment.

FIG. 7A illustrates an exemplary process for constructing a compressed block from a slice buffer, according to one embodiment. A 128K byte uncompressed tabular slice buffer 701 stored in a memory buffer is compressed by compressor 702 in the increment of 32K bytes. Memory buffers of database server 101 or compression hardware 620 may be used for temporary storage of tabular slice buffer 701. Each compressed data block 703*a* is contiguously stored in a compressed block 703. If the size of the compressed block 703 is bigger than the total size of compressed data blocks 703*a*, the compressed block 703 is filled with slack space 703*b*. The size of CBLOCK 703 is smaller than the uncompressed slice buffer 701 and the data compression rate is primarily determined by the compressor 702 and the data contained in the slice buffer 701.

Figure 7B:
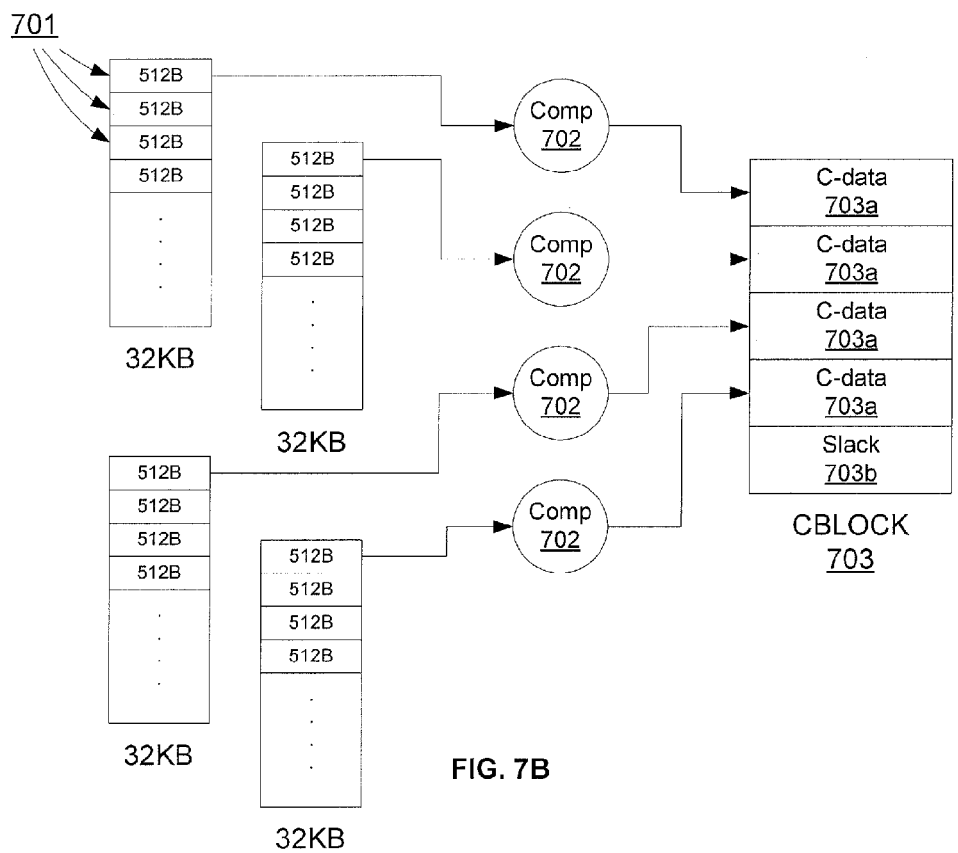
FIG. 7B illustrates an exemplary process for constructing a compressed block from several slice buffers, according to one embodiment.

FIG. 7B illustrates an exemplary process for constructing a compressed block from several slice buffers, according to one embodiment. Uncompressed slice buffers 701, with a size of 512 bytes, are stored in a memory buffer. The data in the memory buffer is compressed by compressor 702 in increments of 32K bytes and contiguously stored in a compressed block 703*a*. When the last part of the memory buffer is less than 32K bytes after it is run through the compressor, metadata is stored in the CBLOCK 703 to identify the size of the last part of the memory buffer so that when the CBLOCK 703 is decompressed, the expected size of the uncompressed data for the memory buffer is known to the decompressor. The other parts of the CBLOCK 703 may be run through the decompressor without referring to the metadata to get the expected uncompressed size of the data since they are compressed with a fixed compression size of 32K bytes.

Figure 8:
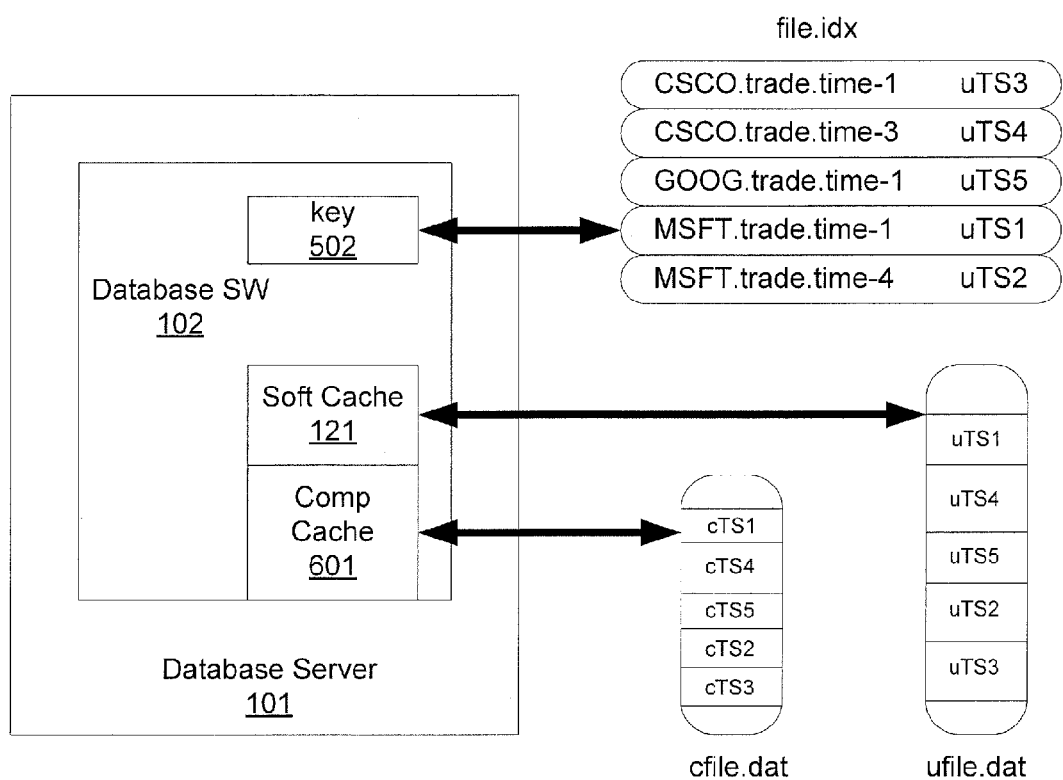
FIG. 8 illustrates an exemplary process for accessing both uncompressed and compressed data files, according to one embodiment.

FIG. 8 illustrates an exemplary process for accessing both uncompressed and compressed data files, according to one embodiment. The mixed usage of compressed and uncompressed formats is transparent to users and other non-compression software in the database, and both compressed and uncompressed files are concurrently accessed without performance degradation. The uncompressed data file, ufile.dat, is accessed from soft-cache 121 while the compressed data file, cfile.dat, is accessed from compression cache 601 and then from soft-cache 121 after it is decompressed, so that only the access to the compressed data file burdens compression cache 601. The subsequent operations on the data in soft-cache 121 are transparent, whether the stored data was compressed or uncompressed.

Uncompressed data file, ufile.dat, contains five slice buffers (uTS1-uTS5). The five slice buffers are stored in contiguous locations. The associated B-Tree index file, file.idx, contains keys and the locations for each of the five uncompressed tabular slices. The compressed data file, cfile.dat, also contains five compressed slice buffers (cTS1-cTS5), since there is a one-to-one correspondence between uncompressed and compressed tabular slices. The interface between database server 101 and the uncompressed data file is through soft-cache 121 and the B-Tree index file, while the interface between database server 101 and the compressed data file is through compression cache 601.

The storage space for the compressed tabular slices is smaller in comparison with the storage space for the uncompressed tabular slices. Since the locations of the compressed tabular slices are different from those of the uncompressed ones, the tick data in the compressed data file cannot be located with the B-Tree index. As a result, a translation map is needed to map the location of the uncompressed tabular slice contained in the index to the location of the compressed tabular slice stored in the compressed data file. Using the translation map, database server 101 provides rapid random access to the compressed data and an efficient mechanism for insert operations.

Database server 101 stores compressed tabular slices in a CBLOCK format to store a large number of compressed tabular slices in a relatively small number of CBLOCKs. The method of storing multiple compressed tabular slices in a CBLOCK as the unit of transfer between memory and database 110 is advantageous over other storage methods. First, the number of CBLOCKs is considerably less than the number of uncompressed tabular slices in a table that reduces the number of keys required in the compression translation map. The size of a CBLOCK is generally larger than the compressed size of a tabular slice, thus the data transfer in between the system memory and database 110 becomes efficient, especially for intelligent storage systems such as Storage Area Networks (SAN) or Network Attached Storage (NAS). Slack space, unused space appended to a CBLOCK to accommodate in-place expansion, may be amortized over multiple compressed tabular slices to increase space efficiency and improve random update performance.

Figure 9:
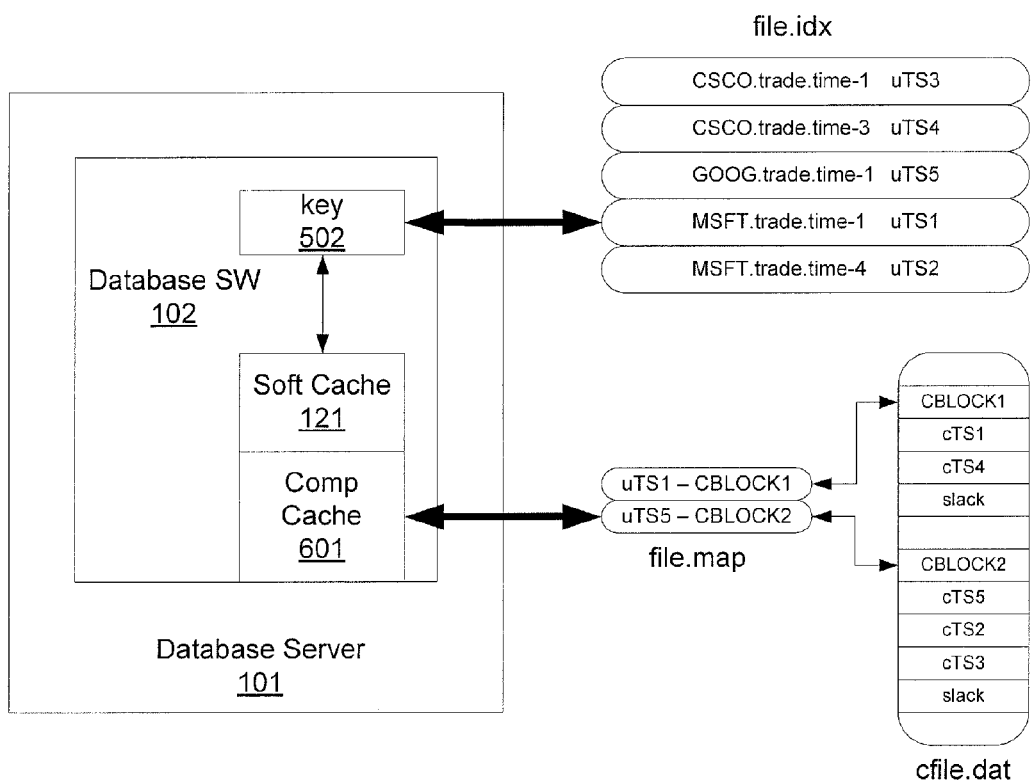
FIG. 9 illustrates an exemplary process for accessing a compressed data file that stores compressed tabular slices in a compressed block format, according to one embodiment.

FIG. 9 illustrates an exemplary process for accessing a compressed data file that stores compressed tabular slices in a compressed block format, according to one embodiment. The B-Tree index is loaded in the same manner as it would be to access an uncompressed data file. Compressed data file, cfile.dat, is loaded and connected with compression cache 601 via compression translation map, "file.map."

Database software 102 accesses the B-Tree index using an application query key 502 to identify the location of a desired uncompressed tabular slice. The location of the desired uncompressed tabular slice is presented to soft-cache 121. Soft-cache 121 identifies the associated compressed data file by the compression type obtained from the file header when the data file was loaded. Soft-cache 121 then passes the request for the uncompressed data to compression cache 601.

Compression cache 601 accesses file.map to identify the location and size of the compressed CBLOCK that contains one or more tabular slices. After the CBLOCK that contains the queried tabular slice is decompressed, the location of the desired uncompressed tabular slice is found using the location information with respect to the first tabular slice in the CBLOCK. Since the query key 502 contains the uncompressed location of the first tabular slice in the CBLOCK and all the tabular slices in the CBLOCK are contiguous in the uncompressed data file, a simple many-to-one mapping is performed to restore any uncompressed tabular slice in the CBLOCK.

This many-to-one mapping is advantageous for accessing compressed data over the one-to-one mapping for accessing uncompressed data or compressed data formatted by a variable size. FIG. 8 shows an uncompressed data file, ufile.dat, that contains five uncompressed tabular slices, namely uTS1, uTS4, uTS5, uTS2 and uTS3. The corresponding B-Tree index file, file.idx, contains five entries, one for each of the uncompressed tabular slices. Similarly, the compressed data file, cfile.dat, contains five compressed tabular slices, cTS1, cTS4, cTS5, cTS2 and cTS3. Each compressed tabular slice is index addressable by the index file. The size of the compressed data file is reduced by compressing data; however, the number of index-addressable entries remain unchanged.

When a data compression block is used (e.g., CBLOCK), the number of index-addressable entries may be reduced so that many-to-one mapping is possible. FIG. 9 shows two index-addressable compressed blocks, CBLOCK1 and CBLOCK2. The translation map, file.map, locates only the two index-addressable compressed blocks and the locations of all the five entries are obtained by referring to the B-Tree index file that stores information regarding the sequence of the entries and the size of each entry.

According to one embodiment, a compressed data stored in the compressed data file, cfile.dat, is accessed in the following steps. First, the location of the uncompressed tabular slice is looked up in the B-Tree index as if it were stored in an uncompressed data file, ufile.dat. Next, this location of the uncompressed data is translated to the location of the CBLOCK 703 that contains the compressed form of the tabular slice in the compressed data file, cfile.dat. The compressed data block CBLOCK 703 is read from cfile.dat and decompressed. The decompressed CBLOCK 703 is delivered to soft-cache 121 for the access. This way, rapid-random access to a compressed data is possible because of the many-to-one mapping and the subsequent reduction in the number of index-addressable entries in the translation map, file.map.

Compression cache 601 accesses the compressed data file, cfile.dat, to read the CBLOCK into compression cache 601. Compression cache 601 locates the desired compressed tabular slice in the CBLOCK, decompresses the data and loads the uncompressed tabular slice into soft-cache 121. The number of CBLOCKs is generally less than the number of uncompressed tabular slices, and the size of the corresponding translation map is quite small, thus efficient and rapid access to the compressed data is achieved. Moreover, since the translation map is implemented using a B-Tree indexing, efficient random access is supported for both query and insert operations.

An access to a compressed tabular slice in a compressed data file starts with a query to the B-Tree index to obtain the location of the uncompressed tabular slice in the uncompressed data file, ufile.dat. It is noted that the location of the tabular slice in the uncompressed data file is a logical representation and does not refer to the physical location of the tabular slice in the compressed data file. After the compressed data file is decompressed, the location of the uncompressed tabular slice is used to access the tabular slice. For example, the location of the uncompressed tabular slice, "GOOG.trade.time–1," is obtained from file.idx, and the location of the corresponding uncompressed tabular slice, uTS5, is identified. Although the location of uTS5 does not refer to the physical location of the queried tabular slice, it is used as the key into the translation map, file.map, to determine the location of the CBLOCK2 that contains cTS5, which is the compressed data of uTS5. After CBLOCK2 is decompressed, the location of uTS5 obtained earlier is used to access the queried tabular slice uTS5.

Figure 10A:
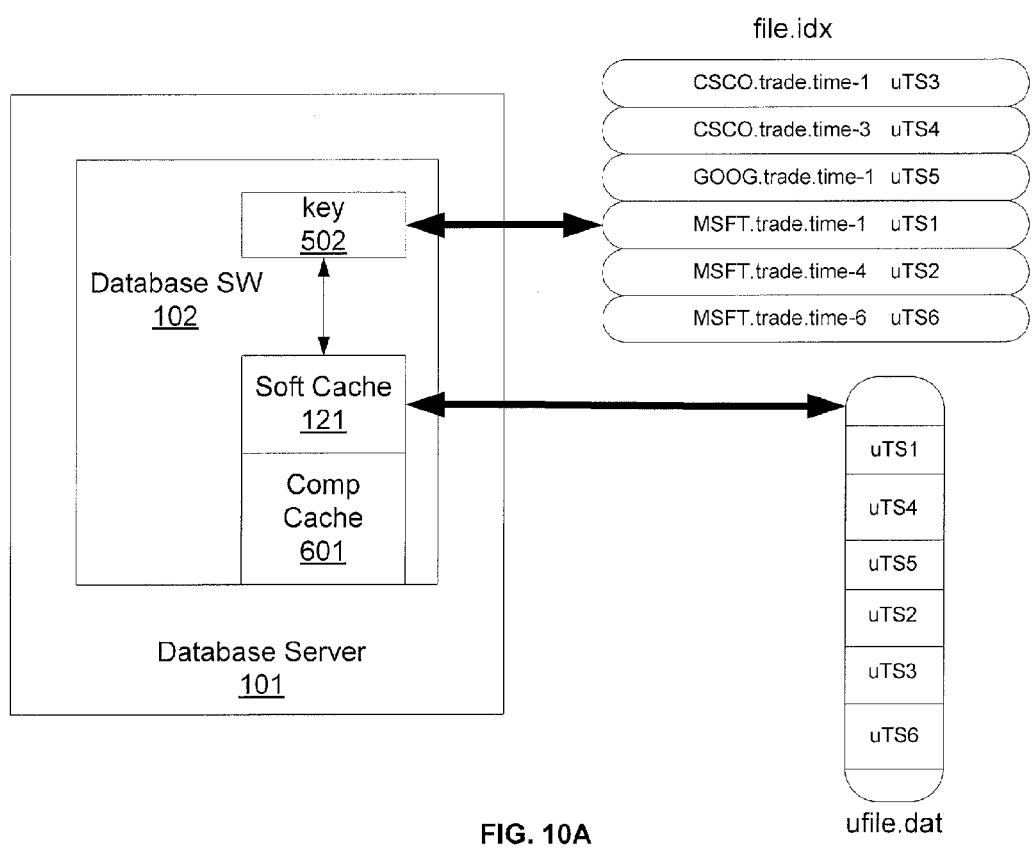
FIG. 10A illustrates an exemplary process for adding a new tabular slice into an uncompressed data file, according to one embodiment.

According to one embodiment, the present method and system creates a new uncompressed tabular slice from data in an incoming tick data stream and allocates a space for the uncompressed tabular slice at the end of an uncompressed data file, even though the uncompressed data file does not exist. When a newly created tabular slice is added into a compressed data file, the location of the uncompressed tabular slice is determined by the relative location of the tabular slice in the uncompressed data file. FIG. 10A illustrates an exemplary process for adding a new tabular slice into an uncompressed data file, according to one embodiment. A new MSFT.trade at time–6 is added at the end of the existing tabular slices and an entry is added into the associated B-Tree index for "MSFT.trade.time–6" that contains the location of the tabular slice uTS6.

Database software 102 accesses the B-Tree index to add a query key that contains the location of the new uncompressed tabular slice in the uncompressed data file. The location is presented to soft-cache 121 along with the data in the uncompressed tabular slice in the same manner as used to access uncompressed data. Soft-cache 121 combines the uncompressed tabular slice with other uncompressed tabular slices that are contiguous in the uncompressed data file and passes a request to write the combined uncompressed tabular slices to compression cache 601. If the associated data file is not compressed, soft-cache 121 writes the combined uncompressed tabular slices directly to the data file without running through compression cache 601.

Figure 10B:
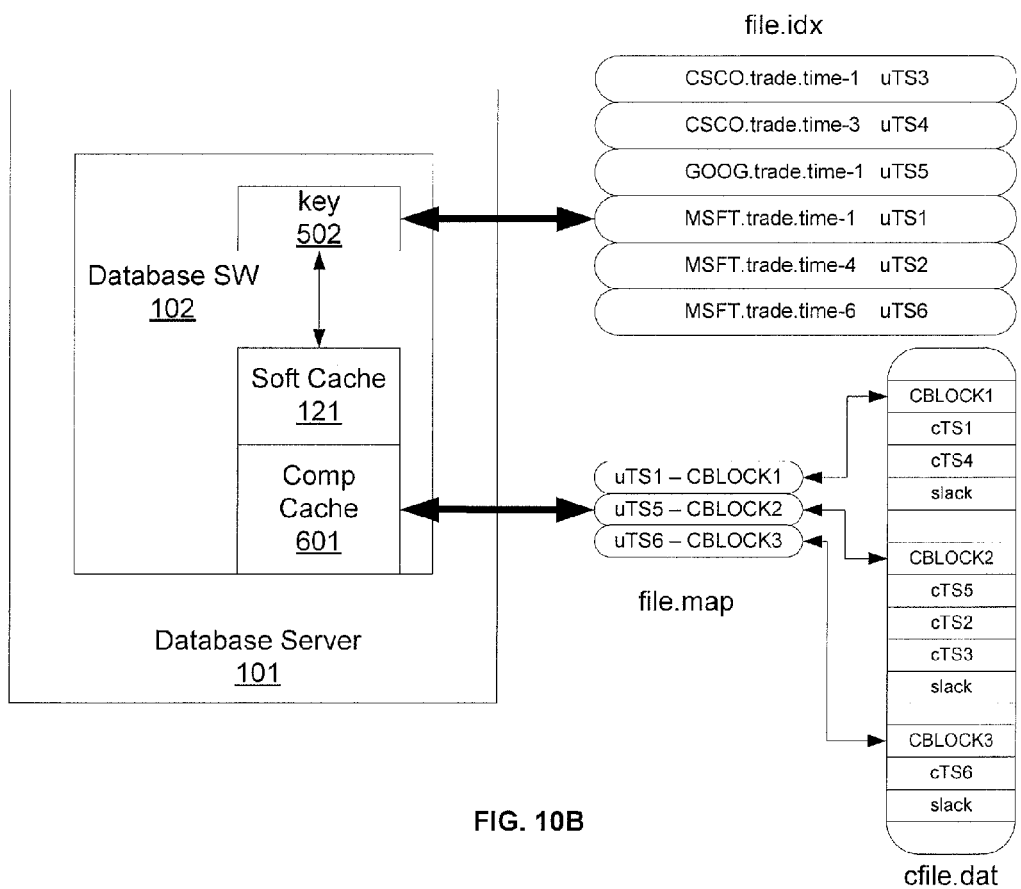
FIG. 10B illustrates an exemplary process for adding a new tabular slice into a compressed data file, according to one embodiment.

FIG. 10B illustrates an exemplary process for adding a new tabular slice into a compressed data file, according to one embodiment. The new tabular slice uTS6 is compressed to cTS6 and a new compressed block, CBLOCK3, is added into the compressed data file, cfile.dat. The location of the tabular slice uTS6 is used to create an entry in the B-Tree index file.idx. It is also used to create an entry in the translation map, file.map, to map the uncompressed location of uTS6 in the uncompressed data file. The uncompressed data file may not physically exist, but the location of the uTS6 is used as the linkage between the user key "MSFT.trade.time–6" and the location of the compressed block CBLOCK3.

According to one embodiment, soft-cache 121 identifies a compressed data file by the compression type read from the header of the data file and passes the request to write the uncompressed tabular slice to compression cache 601. Compression cache 601 selects a hardware compressor, compresses the uncompressed data in the CBLOCK, stores the metadata in the CBLOCK, updates the translation map for the new CBLOCK and writes the CBLOCK into the compressed data file.

According to one embodiment, a CBLOCK includes metadata for the component compressed tabular slices. This metadata is maintained in the CBLOCK and is available when performing operations on the CBLOCK. For example, metadata includes the size of each compressed tabular slice, the location of each compressed tabular slice in the uncompressed table, the size of the corresponding uncompressed tabular slice and an indicator that identifies tabular slices that are stored in the CBLOCK in uncompressed form.

According to one embodiment, an uncompressed tabular slice is stored in a CBLOCK in an uncompressed form. since slice buffers are opaque binary objects, the tabular slice contained therein can be in either compressed or uncompressed form. The present method and system is capable of handling tabular slices that are not compressible because of the nature of the data or because of compressor malfunction without special handling. If the metadata in the CBLOCK identifies a tabular slice containing uncompressed data, the data is transferred directly from the CBLOCK to soft-cache 121. If the metadata in the CBLOCK identifies a tabular slice containing compressed data, compression cache 601 selects a compatible decompressor from the available pool and decompresses the data before transferring to soft-cache 121.

According to one embodiment, all tabular slices are accessed by database 110 in uncompressed form in soft-cache 121. The integrated compression engine guarantees to transfer uncompressed tabular slices in soft-cache 121 to the corresponding data file, regardless of whether or not the data file is compressed. For uncompressed data files, uncompressed slice buffers are accessed and updated directly to the corresponding uncompressed data file. For compressed data files, uncompressed slice buffers are processed by compression cache 601 and are accessed and updated to the corresponding compressed data file. In this manner, data compression hardware can be transparently retrofitted to a software-based data compression system and all its client applications.

According to one embodiment, the present method and system utilizes thread technology to fully exploit the parallelism inherent in the hardware. For example, database software 102 utilizes multiple threads to exploit the parallelism inherent in the multi-core technology of Windows Server platforms and this compression method leverages and expands the use of threads in accesses to data compression hardware cards.

According to one embodiment, database software 102 utilizes multiple compression threads to maximize throughput by taking full advantage of the compression engine load balancing provided in the compression hardware. Multiple concurrent threads are used to decompress data in a CBLOCK. Each thread decompresses a subset of the data in a CBLOCK and each thread can concurrently run a compression engine in compression hardware, resulting in a highly parallel decompression operation.

According to one embodiment, database software 102 utilizes multiple I/O and compression threads to achieve maximum parallelism between I/O and compression. When multiple CBLOCKs are read from a compressed data file to satisfy a request for data, a multi-threaded read pipeline is executed. For example, one thread reads CBLOCKs from the data file in the fastest and most efficient order into a software pipeline in compression cache 601 Another thread processes the CBLOCKs in compression cache pipeline to decompress data in the CBLOCKs. Another thread loads the uncompressed tabular slices from the CBLOCKs into soft-cache 121, processes the uncompressed tabular slices and delivers tick data to the client query. This pipeline architecture takes full advantage of the multi-core technology in the Windows Server platform and the parallelism in the compression hardware to achieve performance improvement for decompressing data. When CBLOCKs are constructed from uncompressed slice buffers in soft-cache 121, a multi-threaded write pipeline is executed. For example, one thread constructs CBLOCKs and another thread writes the CBLOCKs to the compressed data file. This pipeline approach provides a high degree of parallelism in the writing of compressed data and achieves performance improvement for compressing data.

A system and method for data compression using compression hardware has been described with respect to specific examples and subsystems. It will be apparent to those of ordinary skill in the art that it is not limited to these specific examples or subsystems but extends to other embodiments as well.

We claim:

1. A computer-implemented method of compressing data, the method comprising:
    receiving a data set in a data stream, the data set including a set of data descriptor fields;
    partitioning the data set into one or more data subsets using the set of data descriptor fields;
    generating one or more tabular slices and an index for at least one of the one or more data subsets using the set of data descriptor fields, the one or more tabular slices identified by the index, and each tabular slice comprising a plurality of rows from the one or more data subsets, wherein the number of rows comprised in each tabular slice is variable;
    compressing the one or more tabular slices into a compressed data block by a data compression scheme using a hardware compressor;
    generating a compression data file in a database, the compression data file having a header that stores information about the data compression scheme; and
    storing the compressed data block in the compression data file.

2. The computer-implemented method of claim 1, wherein the data set includes financial tick data.

3. The computer-implemented method of claim 2, wherein the set of data descriptor fields includes tick symbol, record type, time and data fields.

4. The computer-implemented method of claim 2, wherein the data stream is a financial tick data stream.

5. The computer-implemented method of claim 2, wherein the data stream is received from a financial data storage.

6. The computer-implemented method of claim 1, wherein generating one or more tabular slices further comprises removing nulls and missing fields from the at least one of the one or more data subsets.

7. The computer-implemented method of claim 1, further comprising:
    mapping the one or more tabular slices to the compressed data block using a many-to-one mapping algorithm;
    generating a translation map that associates the one or more tabular slices and the compressed data block; and
    storing the translation map in the database.

8. The computer-implemented method of claim 7, wherein the many-to-one mapping algorithm is one or more of round-robin by symbol algorithm or symbol directed algorithm.

9. The computer-implemented method of claim 1, wherein the compressed data block is partly compressed with the hardware compressor.

10. The computer-implemented method of claim 7, further comprising:
    receiving a query request from a client to read the at least one of the one or more data subsets;
    identifying the one or more tabular slices via at least one data descriptor field of the set of data descriptor fields using the index;
    identifying the compressed data block storing the one or more tabular slices using the translation map;
    identifying the compression data file storing the compressed data block;
    locating the compression data file from the database;
    copying the compressed data block from the compression data file into a memory buffer;
    identifying the compression scheme from the header of the compression data file;
    decompressing the one or more tabular slices from the compressed data block using a decompressor that supports the compression scheme; and
    presenting the at least one of the one or more data subsets.

11. The computer-implemented method of claim 10, further comprising:
    transforming the one or more tabular slices into a desired format that the client requested; and
    presenting the at least one of the one or more data subsets to the client in the desired format.

12. The computer-implemented method of claim 10, further comprising:
    detecting malfunction of the hardware compressor;
    redirecting the query request to a second hardware compressor using a compression failover policy; and
    continuing to process the query request from the client by the compression failover policy.

13. The computer-implemented method of claim 12, wherein the compression failover policy includes "abort-on-error," "failover to alternate hardware engine," "failover to compressor bypass" and "failover to software decompress."

14. The computer-implemented method of claim 1, wherein the size of the one or more tabular slices is determined by a dynamic algorithm based on streaming rate, I/O bandwidth of the database or historically the most efficient size for query access.

15. The computer-implemented method of claim 1, wherein partitioning the data set into one or more data subsets comprises partitioning the data set into a plurality of data subsets.

16. A non-transitory computer-readable storage medium storing a plurality of instructions that, when executed by a computing system, cause the computing system to:
    receive a data set in a data stream, the data set including a set of data descriptor fields;
    partition the data set into one or more data subsets using the set of data descriptor fields;
    generate one or more tabular slices and an index for at least one of the one or more data subsets using the set of data descriptor fields, the one or more tabular slices identified by the index, and each tablar slice comprising a plurality of rows from the one or more data subsets, wherein the number of rows comprised in each tabular slice is variable;
    compress the one or more tabular slices into a compressed data block by a data compression scheme using a hardware compressor;
    generate a compression data file in a database, the compression data file having a header that stores information about the data compression scheme; and
    store the compressed data block in the compression data file.

17. The non-transitory computer-readable storage medium of claim 16, wherein the data set includes financial tick data.

18. The non-transitory computer-readable storage medium of claim 17, wherein the set of data descriptor fields includes tick symbol, record type, time and data fields.

19. The non-transitory computer-readable storage medium of claim 17, wherein the data stream is a financial tick data stream.

20. The non-transitory computer-readable storage medium of claim 17, wherein the data stream is received from a financial data storage.

21. The non-transitory computer-readable storage medium of claim 16, wherein instructions that cause the computing system to generate one or more tabular slices further comprise instructions that, when executed by the computing system, cause the computing system to remove nulls and missing fields from the at least one of the one or more data subsets.

22. The non-transitory computer-readable storage medium of claim 16, further storing instructions that, when executed by the computing system, cause the computing system to:
    map the one or more tabular slices to the compressed data block using a many-to-one mapping algorithm;
    generate a translation map that associates the one or more tabular slices and the compressed data block; and
    store the translation map in the database.

23. The non-transitory computer-readable storage medium of claim 22, wherein the many-to-one mapping algorithm is one or more of round-robin by symbol algorithm or symbol directed algorithm.

24. The non-transitory computer-readable storage medium of claim 16, wherein the compressed data block is partly compressed with the hardware compressor.

25. The non-transitory computer-readable storage medium of claim 22, further storing instructions that, when executed by the computing system, cause the computing system to:
    receive a query request from a client to read the at least one of the one or more data subsets;
    identify the one or more tabular slices via at least one data descriptor field of the set of data descriptor fields using the index;
    identify the compressed data block storing the one or more tabular slices using the translation map;
    identify the compression data file storing the compressed data block;
    locate the compression data file from the database;
    copy the compressed data block from the compression data file into a memory buffer;
    identify the compression scheme from the header of the compression data file;
    decompress the one or more tabular slices from the compressed data block using a decompressor that supports the compression scheme; and
    present the at least one of the one or more data subsets.

26. The non-transitory computer-readable storage medium of claim 25, further storing instructions that, when executed by the computing system, cause the computing system to:
    transform the one or more tabular slices into a desired format that the client requested; and
    present the at least one of the one or more data subsets to the client in the desired format.

27. The non-transitory computer-readable storage medium of claim 25, further storing instructions that, when executed by the computing system, cause the computing system to:
    detect malfunction of the hardware compressor;

redirect the query request to a second hardware compressor using a compression failover policy; and continue to process the query request from the client by the compression failover policy.

28. The non-transitory computer-readable storage medium of claim 27, wherein the compression failover policy includes "abort-on-error," "failover to alternate hardware engine," "failover to compressor bypass" and "failover to software decompress."

29. The non-transitory computer-readable storage medium of claim 16, wherein the size of the one or more tabular slices is determined by a dynamic algorithm based on streaming rate, I/O bandwidth of the database or historically the most efficient size for query access.

30. The non-transitory computer-readable storage medium of claim 16, wherein the plurality of instructions, when executed by a computing system, further cause the computing system partition the data set into a plurality of data subsets.

* * * * *

UNITED STATES PATENT AND TRADEMARK OFFICE
CERTIFICATE OF CORRECTION

PATENT NO. : 8,538,936 B2
APPLICATION NO. : 13/190099
DATED : September 17, 2013
INVENTOR(S) : Kenneth Allen Williams et al.

It is certified that error appears in the above-identified patent and that said Letters Patent is hereby corrected as shown below:

In the Specification

Column 7, line 59, replace "database 1 10, synchronizes" with --database 110, synchronizes--.

Column 8, line 23, replace "database 1 10, according" with --database 110, according--.

In the Claims

Column 17, line 58, replace "each tablar slice comprising" with --each tabular slice comprising--.

Signed and Sealed this
Twenty-sixth Day of November, 2013

Margaret A. Focarino
*Commissioner for Patents of the United States Patent and Trademark Office*